(12) United States Patent
Jorgenson et al.

(10) Patent No.: US 7,101,721 B2
(45) Date of Patent: Sep. 5, 2006

(54) ADAPTIVE MANUFACTURING FOR FILM BULK ACOUSTIC WAVE RESONATORS

(75) Inventors: Jon D. Jorgenson, Greensboro, NC (US); David Dening, Stokesdale, NC (US); Victor Steel, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 410 days.

(21) Appl. No.: 10/200,237

(22) Filed: Jul. 22, 2002

(65) Prior Publication Data

US 2004/0014249 A1 Jan. 22, 2004

(51) Int. Cl.
*H01L 21/66* (2006.01)

(52) U.S. Cl. .............................. 438/14; 438/15; 310/346
(58) Field of Classification Search .................. 438/14, 438/15; 310/346
See application file for complete search history.

(56) References Cited

U.S. PATENT DOCUMENTS

| | | | | |
|---|---|---|---|---|
| 4,320,365 A | * | 3/1982 | Black et al. ................. | 333/187 |
| 4,456,850 A | * | 6/1984 | Inoue et al. ................. | 310/324 |
| 5,212,988 A | * | 5/1993 | White et al. .................. | 73/599 |
| 5,235,135 A | * | 8/1993 | Knecht et al. ............. | 174/52.3 |
| 5,294,898 A | * | 3/1994 | Dworsky et al. ........... | 333/187 |
| 5,321,685 A | * | 6/1994 | Nose et al. ................. | 369/126 |
| 5,587,620 A | * | 12/1996 | Ruby et al. ................. | 310/346 |
| 6,051,907 A | | 4/2000 | Ylilammi .................... | 310/312 |
| 6,060,818 A | | 5/2000 | Ruby et al. ................. | 310/363 |
| 6,507,983 B1 | * | 1/2003 | Ruby et al. ................ | 29/25.35 |

OTHER PUBLICATIONS

Agilent Technologies, "Agilent Technologies Announces New Miniature Duplexer Technology for CDMA Hardware," Palo Alto, CA, Feb. 22, 2000, http://www.agilent.com/about/newsroom/presrel/2000/22feb2000b.html.
Agilent Technologies, "Agilent Technologies Builds Production Fab and Assembly Lines for FBAR Duplexer," Palo Alto, CA, Aug. 8, 2000, http://www.semiconductor/agilent.com/news/pr/08aug2000.html.
Agilent Technologies, "A Brief Overview of FBAR Technology," Dec. 10, 1999.
Rossnagel, S. M., "Sputter Deposition for Semiconductor Manufacturing," IBM Journal of Research & Development, 1998, http://www.research.ibm.com/journal/rd/431/rossnagel.html.
Plummer et al., "Thin Film Deposition—Chapter 9," *Silicon VLSI Technology—Fundamentals, Practice and Modeling*, Prentice Hall, Upper Saddle River, NJ, 2000.

* cited by examiner

*Primary Examiner*—John F. Niebling
*Assistant Examiner*—Olivia T. Luk
(74) *Attorney, Agent, or Firm*—Withrow & Terranova, PLLC

(57) ABSTRACT

An adaptive manufacturing process for a Film Bulk Acoustic Resonator (FBAR) tests the FBAR circuit during manufacturing to determine a resonant frequency thereof. Reactive tuning elements may be adjusted as needed depending on the testing to change the resonant frequency to a desired resonant frequency. In an exemplary embodiment, predetermined masks may be applied to modify the tuning elements.

14 Claims, 8 Drawing Sheets

ADAPTIVE MANUFACTURING FOR FILM BULK ACOUSTIC WAVE RESONATORS

FIELD OF THE INVENTION

The present invention relates to a method for tuning Film Bulk Acoustic Wave Resonators by applying adaptive manufacturing techniques to tuning elements associated with the resonators.

BACKGROUND OF THE INVENTION

A thin Film Bulk Acoustic Resonator (FBAR) is a technology that creates a frequency shaping element found in many modern wireless systems. When an alternating electrical potential is applied across the FBAR, a layer within the FBAR expands and contracts, creating a vibration. The vibrating membrane creates a high Q mechanical resonance. An FBAR may thus be used for a filter, duplexer, resonator, or the like.

It is, however, difficult to manufacture FBARs to the rigorous standards required by industry. Minute variations in the thickness of the layers which comprise the FBARs may result in unacceptable deviations in the operating frequency of the FBAR, resulting in an unacceptable product.

One technique to address the concern of manufacturing variations has been pioneered by Nokia and is explained in U.S. Pat. No. 6,051,907, which is hereby incorporated by reference in its entirety. While the techniques described in this patent are adequate, commercial need dictates that alternate approaches be made available for increased competitive opportunities.

SUMMARY OF THE INVENTION

The present invention manufactures Film Bulk Acoustic Resonators (FBARs) and applies adaptive manufacturing techniques to the tuning elements associated with the FBAR. By changing the capacitors and inductors associated with the FBAR, the filter response of the FBAR may be tuned to the desired response without needing to alter the layer thickness of the resonator itself.

In an exemplary embodiment, the FBAR is manufactured and tested to determine its resonant frequency. The resultant resonant frequency will be placed into a bin corresponding roughly to "correct," "too high," or "too low" values. Finer gradations may also be used. The FBAR is then combined with variable inductors or capacitors as needed to tune the FBAR to the desired frequency response. The inductors and capacitors are tuned through an adaptive manufacturing technique to further tune the FBAR to the desired frequency response.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1A:
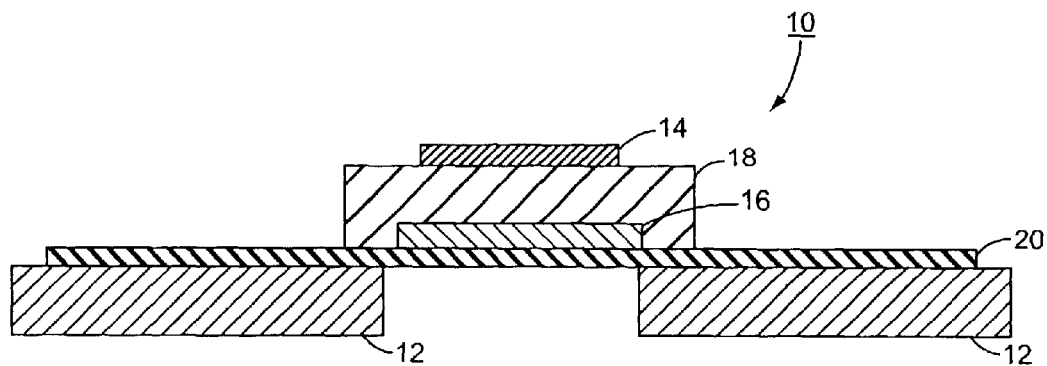
FIGS. 1A and 1B illustrate alternate conventional FBARs such as may be used with the present invention.
Figure 1B:
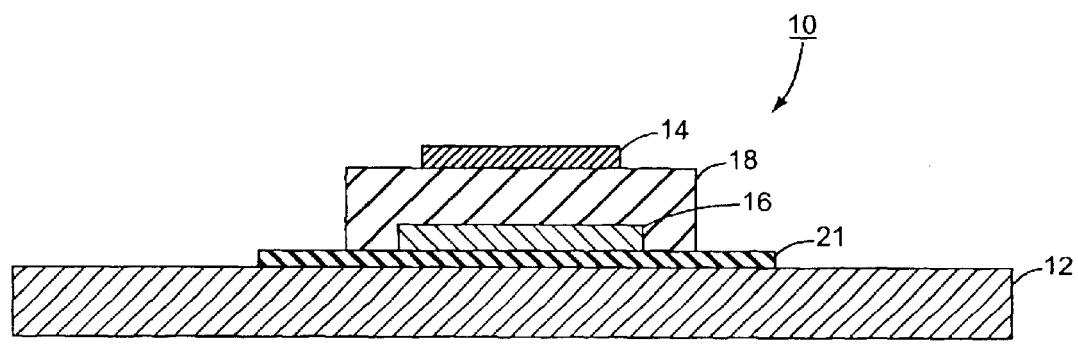

Film Bulk Acoustic Resonators (FBARs) are well known in the electronics industry. An exemplary, conventional FBAR 10 is illustrated in FIG. 1A, wherein the FBAR 10 is positioned on a wafer 12. The FBAR 10 includes a top electrode 14, a bottom electrode 16, a piezoelectric layer 18, and a bridge or "membrane" layer 20. The wafer 12 may have a recess or hole under the piezoelectric layer 18 so as to avoid "loading" the resonating layer. In an exemplary embodiment, the top and bottom electrodes 14, 16 may be Molybdenum (Mo) and the piezoelectric layer 18 may be zinc-oxide (ZnO). The bridge layer 20 may be silicon-dioxide ($SiO_2$). An alternate construction, shown in FIG. 1B uses a solid wafer 12 with an acoustic mirror 21. The acoustic mirror 21 is composed of alternating half wavelength layers of high density and low density material that create an acoustical "high-reflective" coating.

Figure 2:
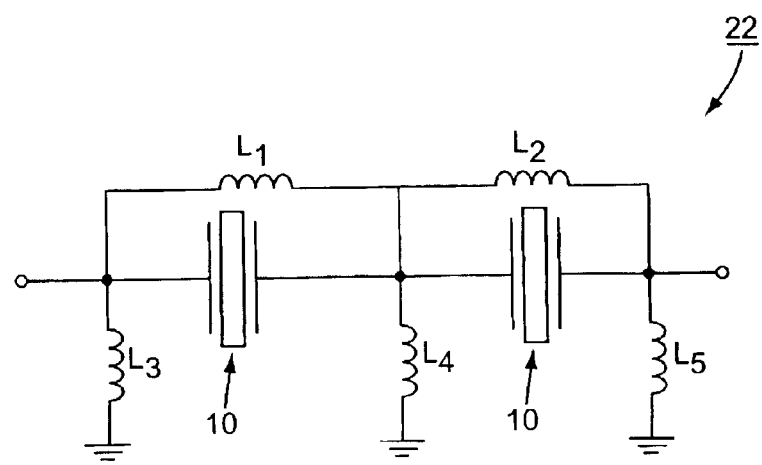
FIG. 2 illustrates schematically an exemplary FBAR with an inductive tuning circuit.
Figure 3:
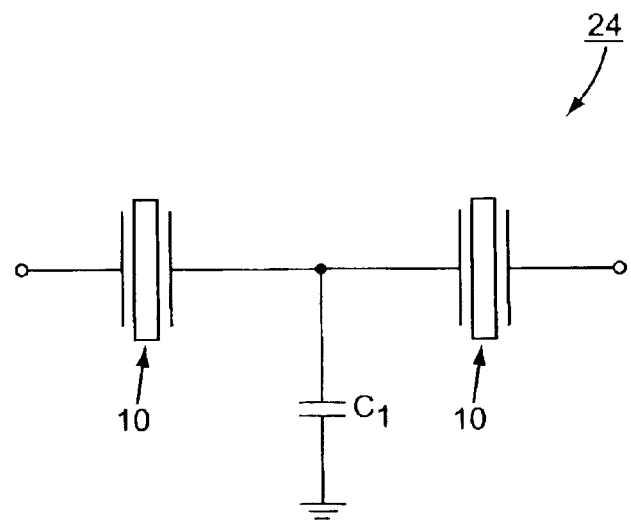
FIG. 3 illustrates schematically an exemplary FBAR with a narrow band ladder filter.
Figure 4:
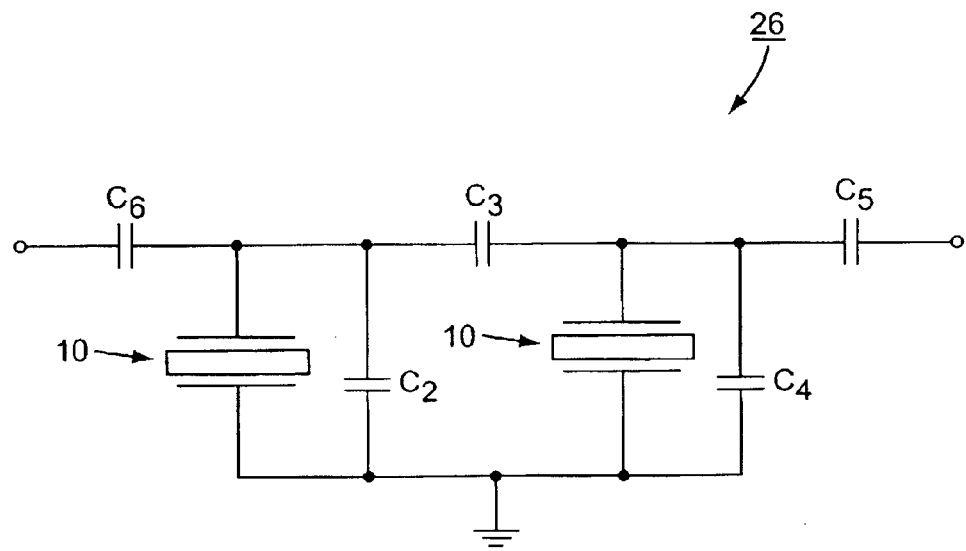
FIG. 4 illustrates schematically an exemplary FBAR with a capacitive tuning circuit.

During manufacturing, the FBAR 10 may have an actual resonant frequency somewhat removed from the desired resonant frequency. To correct for this, a tuning circuit may be used in conjunction with the FBAR 10. Such tuning circuits may be formed from capacitors and/or inductors as is well understood in the field of circuit design. FIGS. 2–4 illustrate exemplary tuning circuits. FIG. 2 illustrates a ladder filter 22 using inductors $L_1$–$L_5$ to resonate out parasitic capacitance. FIG. 3 illustrates a two pole narrow band ladder filter 24 with two FBARs 10 and a capacitor $C_1$. FIG. 4 illustrates a bandpass filter 26 using FBAR 10 resonators and capacitors $C_2$–$C_6$ for coupling and tuning.

It should be appreciated that other tuning circuits may be used as needed or desired depending on the intended purpose of the FBAR 10. Further, the adaptive manufacturing techniques of commonly owned U.S. patent application Ser. No. 09/545,128, filed 07 Apr. 2000, now U.S. Pat. No. 6,448,793, which is hereby incorporated by reference in its entirety, may be used to refine the tuning. For simplicity, some of the incorporated application is herein repeated.

Variation in wafer processing has a negative impact throughout the design, processing, and application of the final device. Variation in certain processes may be compensated for by changing the nature of subsequent processes, if the parameter in question can be measured in time for such a compensation to be made.

Figure 5:
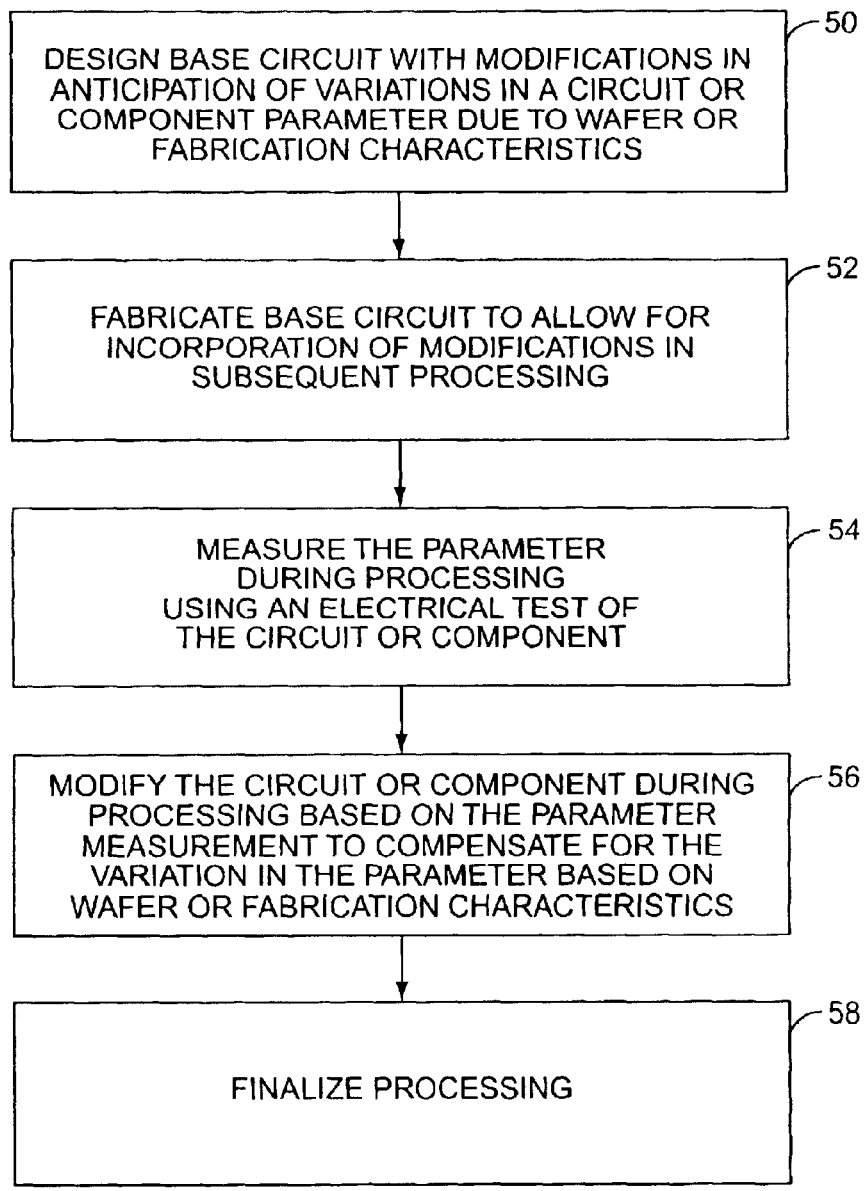
FIG. 5 illustrates a flow chart embodying the methodology of an adaptive manufacturing process.

The basic manufacturing process according to the incorporated application is presented in FIG. 5. Typically, semiconductor circuitry is designed with known process variations in mind. Preferably, a primary circuit is designed with one or more modifications configured to compensate for anticipated process variations (block 50). Once the primary circuit is designed with modifications in anticipation of process variations, the primary circuit is fabricated during a semiconductor process to allow for modifications as necessary in subsequent processing (block 52).

Once the primary circuit design is implemented, an electrical test is conducted during the fabrication process to measure a component or overall circuit parameter (block 54). During the testing, it may be determined if the parameter is within design tolerances, too high, or too low. Based on this determination, the circuit, or a component within the circuit, may be modified during another round of processing to compensate for variation in the parameter based on wafer or fabrication techniques (block 56). After modification, the semiconductor processing is finalized (block 58) to provide a semiconductor device that is compensated for variation in the parameter.

Figure 6:
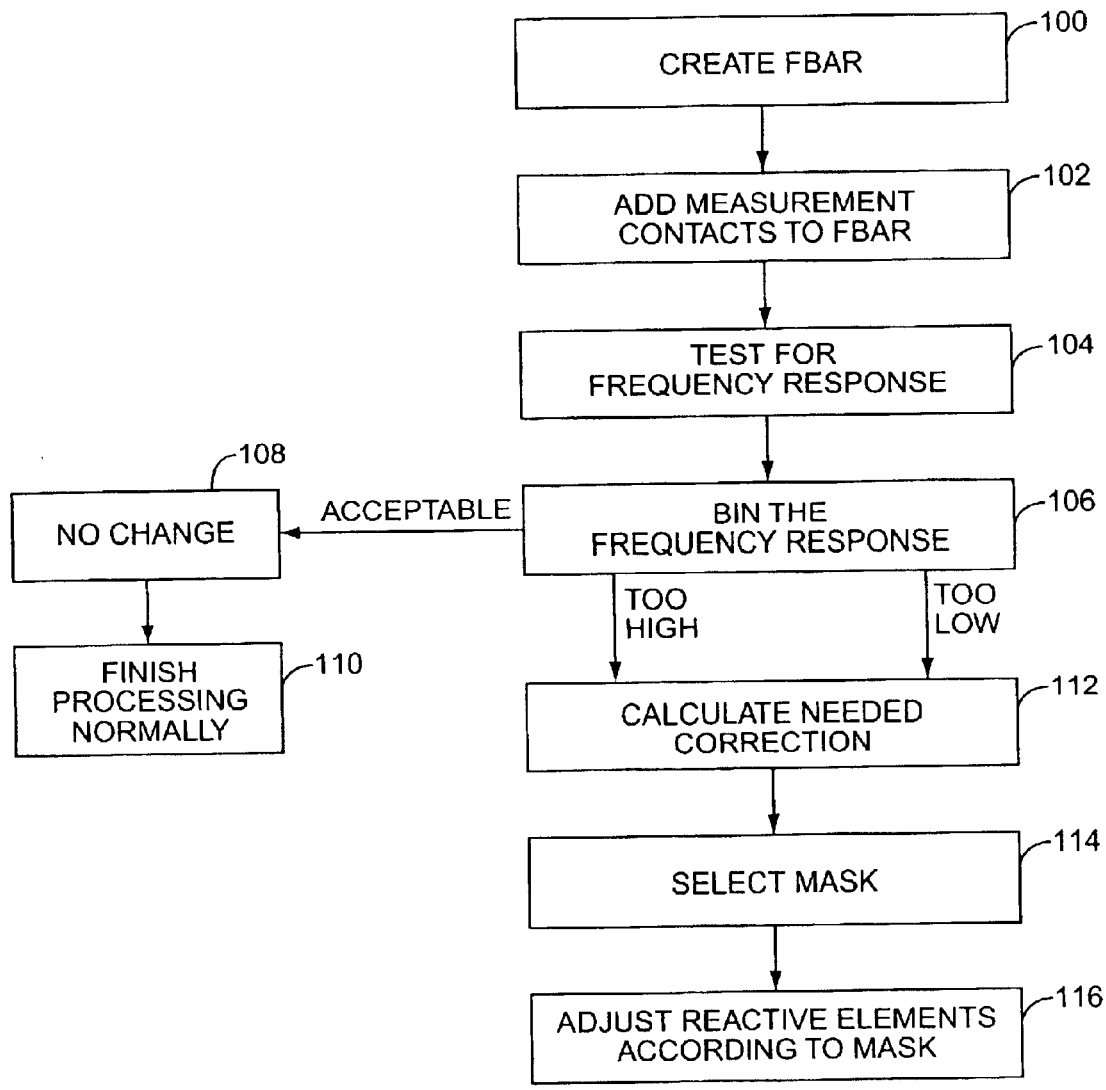
FIG. 6 illustrates a flow chart embodying the methodology of the present invention as applied to FBARs.

Against that general backdrop, the more specific adaptive manufacturing techniques may be applied with some specificity to the present invention. A detailed explanation, as used with respect to FBARs 10, for the semiconductor manufacturing process used to tune FBARs 10 according to the present invention is presented with reference to FIG. 6. The FBAR 10 is created (block 100) using conventional manufacturing techniques, such as a sputter deposition technique, those outlined in U.S. Pat. No. 6,060,818, which is hereby incorporated by reference, or the like. The FBAR 10 may have a resonant frequency that is the result of manufacturing that is different from a desired resonant frequency, and thus, the next step of the manufacturing process is to test the resonant frequency of the one or more FBARs 10 on the silicon chip being manufactured. To do this testing, measurement contacts are added to one or more FBARs 10 (block 102).

Figure 7:
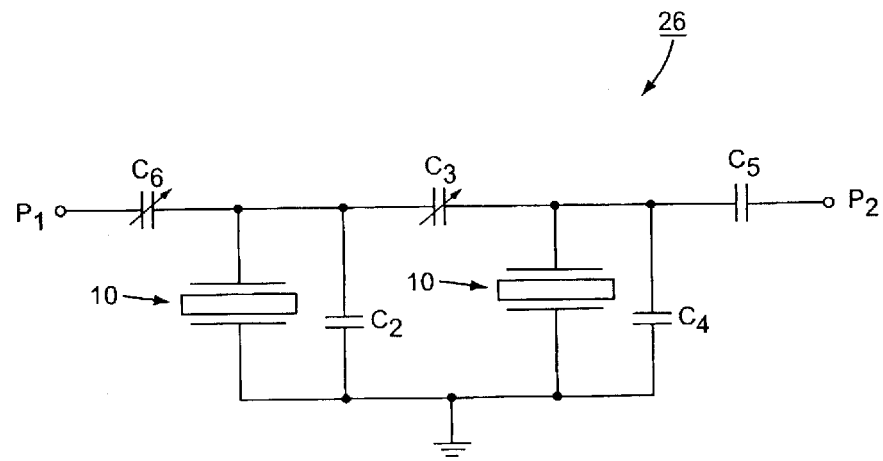
FIG. 7 illustrates an alternate presentation of the circuit of FIG. 4.
Figure 8:
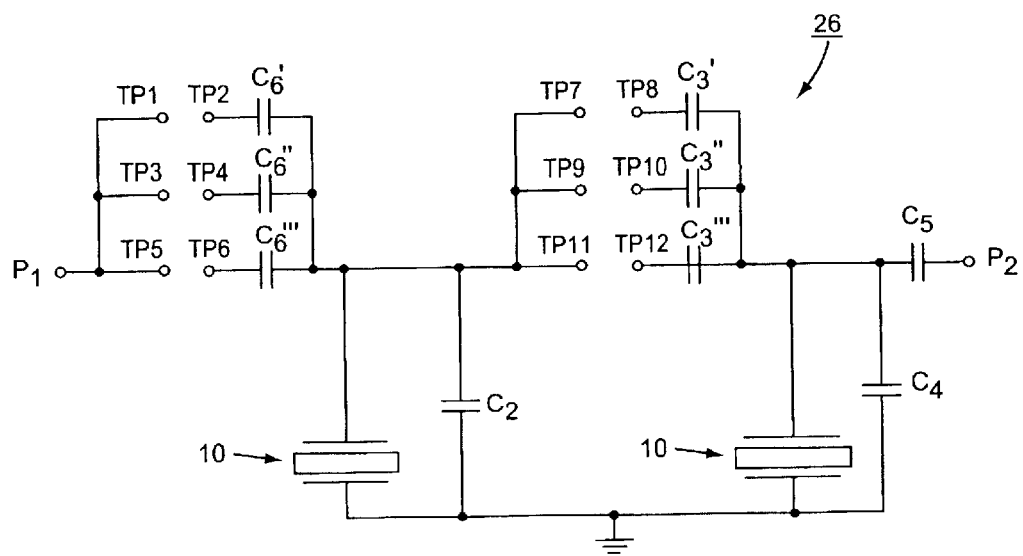
FIG. 8 illustrates an expanded view of the circuit of FIG. 7.

Concurrently with the creation of the FBARs 10, reactive tuning elements such as capacitors and inductors may also be created. The reactive elements may be capacitors or inductors and may form circuits comparable to circuits embodying filters 22, 24, 26 or the like as previously described. It should further be noted that the reactive elements are manufactured on the same wafer 12 as the FBAR 10, and thus may be part of a single integrated semiconductor circuit. Further, the reactive elements should be fabricated in such a manner that modifications thereto are readily accomplished in keeping with block 52 of FIG. 5. Thus, for example, one or more of the capacitors $C_2$–$C_6$ may in fact be varactors of sorts as illustrated in FIG. 7, and more particularly may be segmented into three capacitive elements $C_x'$, $C_x''$, and $C_x'''$, where x is the capacitor number as illustrated in FIG. 8. Electrical taps that allow connections to segments of the capacitive elements are generally labeled TPx. A circuit design may contemplate the capacitors $C_x'$, $C_x''$, and $C_x'''$ arranged in parallel as shown, or in series as needed or desired.

After addition of the measurement contacts to the FBAR 10, the FBAR 10 may be tested for the frequency response (block 104). This testing may also be considered testing for a parameter in keeping with block 54 of FIG. 5. Other parameters may also be tested, if needed. Connection points $P_1$ and $P_2$ (in the example of the circuit of bandpass filter 26 in FIGS. 7–10) may be used to conduct an electrical test of the whole circuit, or taps $P_3$ and $P_4$ may be positioned on either side of an FBAR 10 or an FBAR device may be constructed in an isolated test structure. The testing device may be connected to a computer or other data processing device such that measurements may be recorded and processed as needed or desired. There are essentially three possible results from the on-wafer testing. The FBAR 10 is placed in bins according to which category they fall into (block 106). This step is also referred to herein as "binning." The first, and preferred, response (at least from a manufacturing point of view) is that the frequency response is "acceptable," in which case no changes are made (block 108) and the wafer is processed normally (block 110). The other two responses, i.e., the frequency response is "too high" or "too low," cause the data processing device to calculate a needed correction (block 112).

Armed with the knowledge of the needed correction, an appropriate mask may be selected (block 114), and the reactive elements are adjusted according to the mask selected (block 116). The masks may be preselected configurations designed to impart known corrections to the FBAR circuits.

Modifications to the circuit by the masks are made by selectively connecting the taps associated with the capacitive elements to control the final capacitance, and thus the resonant frequency of the circuit of bandpass filter 26 (in this example). The taps TPx may be used to connect a capacitance to the circuit or to connect an element to another part of the circuit. While the example is made using the capacitors $C_2$–$C_6$, it should be appreciated that similar efforts may be performed on the inductors as needed or desired. The inductors would likely be connected in series, and shorts or open circuits added as needed or desired. Inductors may be adjusted by moving metal shunts that short various segments or turns in the metal pattern of the inductors to add or subtract inductance. Equivalently, the line length of the inductor may be adjusted in a trombone type structure. More information on masks may be found in the previously incorporated '128 application.

Figure 9:
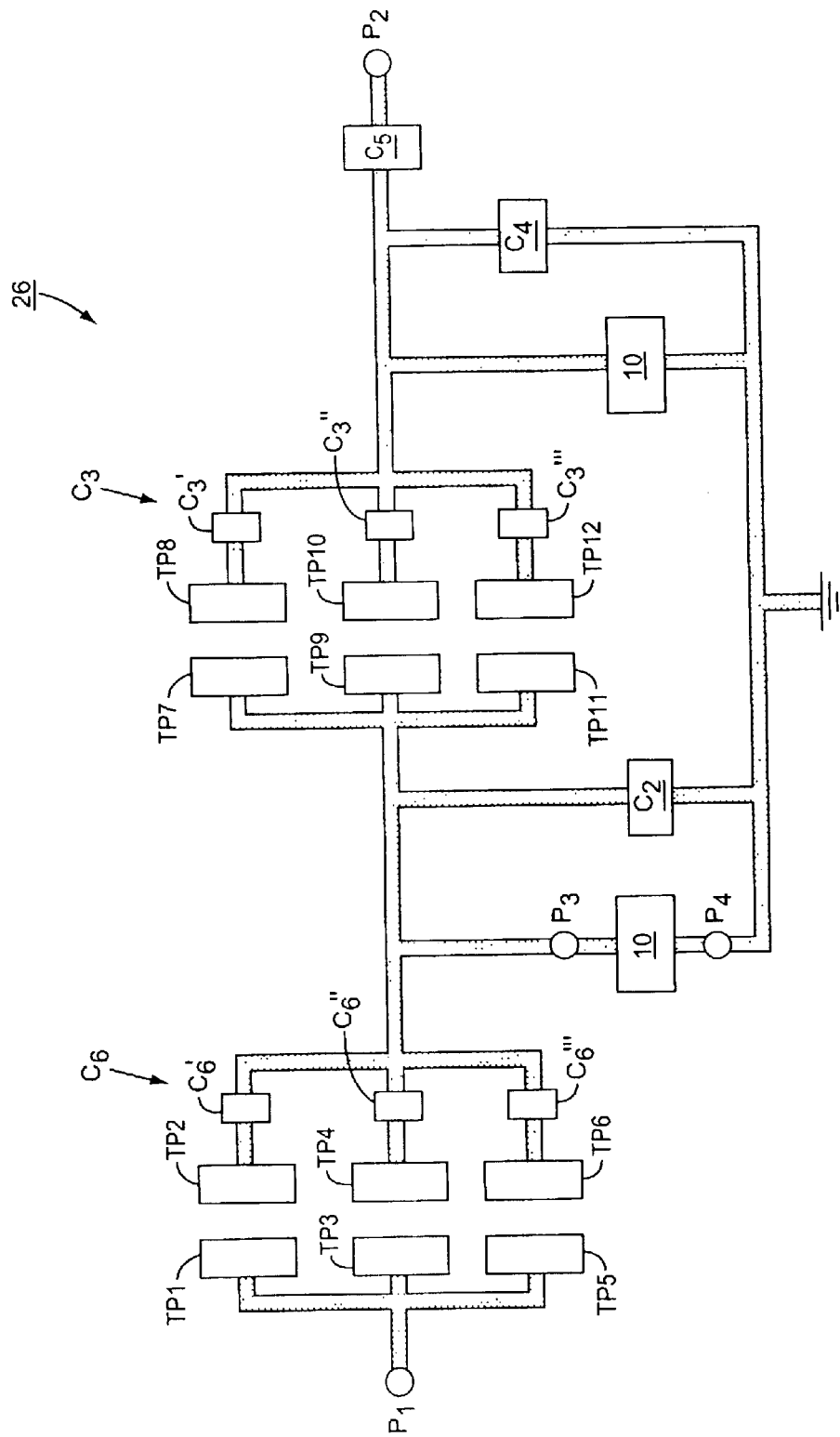
FIG. 9 illustrates a first schematic of connections between elements for the circuit of FIG. 8.

Continuing the example of the modification to the circuit of bandpass filter 26, FIG. 9 represents the circuitry of FIG. 8 as formed on a semiconductor wafer. FBARs 10 are shown in block form and metal traces connecting the various elements are shown in darkened lines. The taps TP1 through TP12 are shown as metal posts or pads connecting the various capacitive elements to one another and to the metal traces as necessary.

Figure 10:
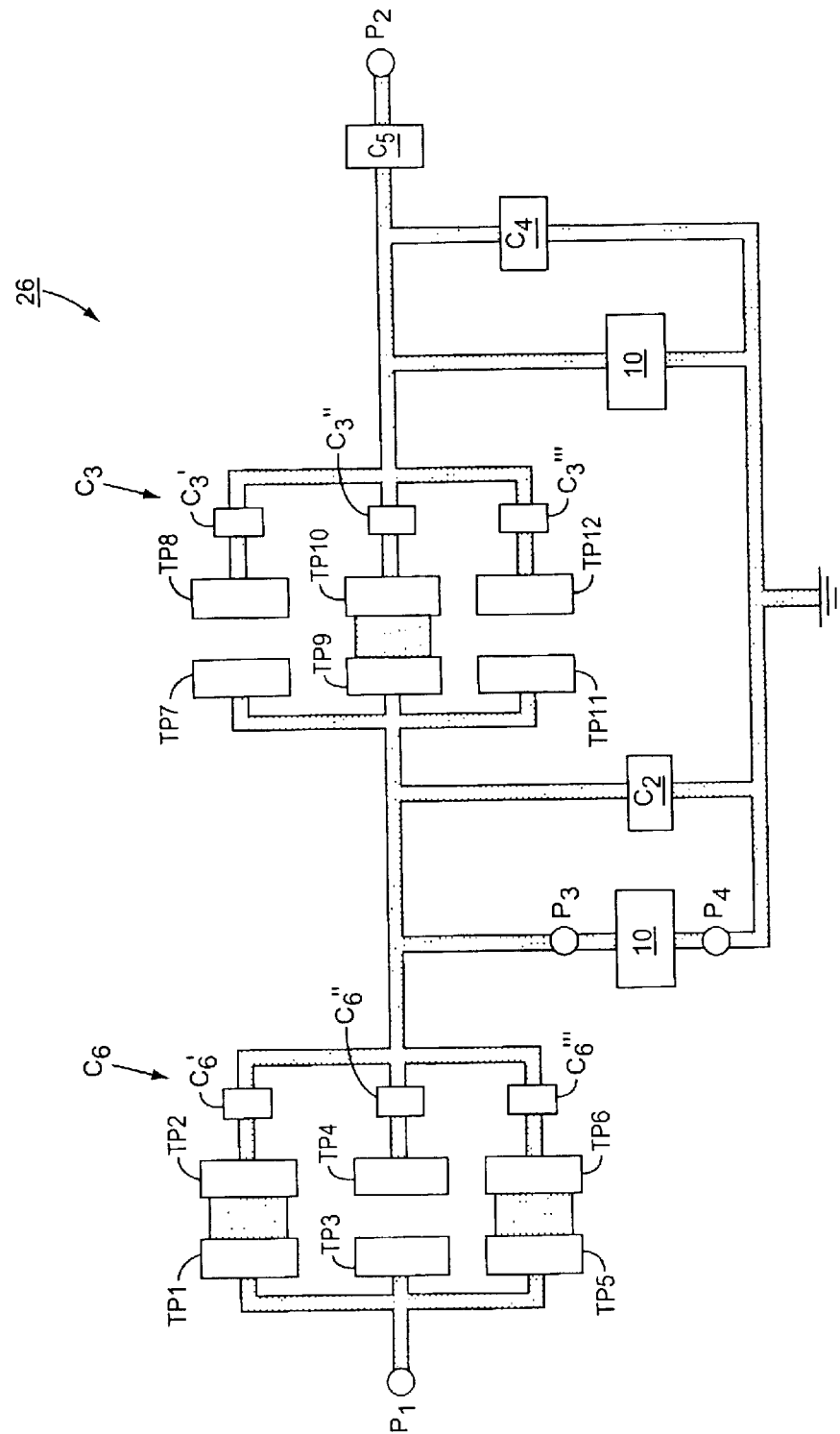
FIG. 10 illustrates the circuit of FIG. 9 after a mask has been applied.

An exemplary top metal mask (TOPM) illustrated in FIG. 10 may short one or more tap points, effectively bringing the capacitive element into the circuit. In the embodiment illustrated in FIG. 10, TP1 and TP2, as well as TP5 and TP6 are shorted, connecting the capacitances of $C_6'$ and $C_6'''$ for $C_6$. Likewise, shorts exist between TP9 and TP10, connecting the capacitance of $C_3''$ for $C_3$. Depending on the needed capacitance to provide the desired resonant frequency, other shorts may be used as is further explained in the '128 application.

Once the modifications have been made, the semiconductor processing is finalized. While three bins are contemplated, the number of bins may be increased if greater resolution is needed to tune the FBAR 10 properly.

Those skilled in the art will recognize improvements and modifications to the preferred embodiments of the present invention. All such improvements and modifications are considered within the scope of the concepts disclosed herein and the claims that follow.

What is claimed is:

1. A method of manufacturing an FBAR, comprising:
   creating an FBAR on a wafer;
   testing the FBAR to determine a resonant frequency;
   coupling at least one reactive element to the FBAR on the wafer to tune the resonant frequency; and
   modifying the at least one reactive element to create a desired resonant frequency.

2. The method of claim 1, wherein testing the FBAR comprises testing the FBAR on-wafer.

3. The method of claim 1, wherein coupling at least one reactive element to the FBAR comprises coupling at least a capacitor to the FBAR.

4. The method of claim 1, wherein coupling at least one reactive element to the FBAR comprises coupling at least an inductor to the FBAR.

5. The method of claim 1, wherein modifying the at least one reactive element comprises applying a mask to the at least one reactive element.

6. The method of claim 1, further comprising binning the FBAR into one of a plurality of bins based on the results of the testing step.

7. The method of claim 1, wherein modifying the at least one reactive element comprises connecting two segments of a capacitor.

8. The method of claim 1, wherein modifying the at least one reactive element comprises shorting turns in an inductor.

9. An adaptive semiconductor manufacturing process comprising:
   initiating fabrication of a semiconductor device incorporating an FBAR circuit;
   during fabrication, testing operation of the FBAR circuit;
   based on the testing step, determining a parameter of the FBAR circuit that is a function of the manufacturing process;
   modifying the FBAR circuit design based on the parameter by selectively adding at least a component to the FBAR circuit design; and
   finalizing fabrication of the semiconductor device.

10. The process of claim 9, wherein the testing step includes electrically testing at least a portion of the circuit design and taking measurements from which the parameter may be determined.

11. The process of claim 9, wherein the modifying step includes selectively making at least one connection within the circuit design based on the parameter.

12. The process of claim 9, wherein the modifying step includes selectively adding a plurality of components to the FBAR circuit design based on the parameter.

13. The process of claim 9, wherein the parameter is a frequency response.

14. An adaptive semiconductor manufacturing process, comprising:
   initiating fabrication of a design in a semiconductor circuit having an FBAR circuit therein, the semiconductor circuit having a plurality of selectable configurations wherein each configuration corresponds to a variation in a parameter value imposed by materials used to manufacture the semiconductor circuit or by the manufacturing process itself;
   during fabrication, testing a portion of the design bearing on the parameter value;
   during fabrication, selecting one of the configurations to implement in the semiconductor circuit; and
   implementing the selected configuration of the design in the semiconductor.

* * * * *